(12) United States Patent
Lee et al.

(10) Patent No.: US 8,952,529 B2
(45) Date of Patent: Feb. 10, 2015

(54) SEMICONDUCTOR DEVICE WITH CONDUCTIVE LAYER OVER SUBSTRATE WITH VENTS TO CHANNEL BUMP MATERIAL AND REDUCE INTERCONNECT VOIDS

(75) Inventors: JaeHyun Lee, Kyunggi-Do (KR); SunJae Kim, Seoul (KR); JoongGi Kim, Pusan (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/303,019

(22) Filed: Nov. 22, 2011

(65) Prior Publication Data

US 2013/0127042 A1 May 23, 2013

(51) Int. Cl.
| | |
|---|---|
| *H01L 23/498* | (2006.01) |
| *H01L 21/50* | (2006.01) |
| *H01L 21/48* | (2006.01) |
| *H01L 23/31* | (2006.01) |
| *H01L 23/00* | (2006.01) |
| *H01L 21/56* | (2006.01) |

(52) U.S. Cl.
CPC .... *H01L 23/49838* (2013.01); *H01L 23/49894* (2013.01); *H01L 21/4867* (2013.01); *H01L 23/3121* (2013.01); *H01L 23/3128* (2013.01); *H01L 24/16* (2013.01); *H01L 2924/13091* (2013.01); *H01L 21/563* (2013.01); *H01L 21/565* (2013.01); *H01L 2224/10175* (2013.01); *H01L 24/13* (2013.01); *H01L 24/81* (2013.01); *H01L 2224/81191* (2013.01); *H01L 2224/81385* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/94* (2013.01); *H01L 2224/16237* (2013.01)
USPC .......... 257/737; 257/E23.068; 257/E21.499; 257/780; 257/779; 257/778; 257/E23.07; 257/783; 257/789; 257/785; 257/738; 257/734; 257/784; 257/781; 438/106

(58) Field of Classification Search
USPC .......... 257/780, 779, 778, E23.07, 783, 789, 257/795, 737, 738, 734, 784, 781; 438/106
See application file for complete search history.

(56) References Cited

U.S. PATENT DOCUMENTS

| | | | | |
|---|---|---|---|---|
| 5,481,119 | A * | 1/1996 | Higashino et al. | 257/34 |
| 6,110,791 | A * | 8/2000 | Kalnitsky et al. | 438/379 |
| 6,268,617 | B1 * | 7/2001 | Hirakata et al. | 257/72 |
| 6,573,610 | B1 | 6/2003 | Tsai | |

(Continued)

*Primary Examiner* — Alexander Oscar Williams
(74) *Attorney, Agent, or Firm* — Robert D. Aktins; Patent Law Group: Atkins and Associates, P.C.

(57) ABSTRACT

A semiconductor device has a semiconductor die with a plurality of bumps formed over a surface of the semiconductor die. A first conductive layer having first and second segments is formed over a surface of the substrate with a first vent separating an end of the first segment and the second segment and a second vent separating an end of the second segment and the first segment. A second conductive layer is formed over the surface of the substrate to electrically connect the first segment and second segment. The thickness of the second conductive layer can be less than a thickness of the first conductive layer to form the first vent and second vent. The semiconductor die is mounted to the substrate with the bumps aligned to the first segment and second segment. Bump material from reflow of the bumps is channeled into the first vent and second vent.

37 Claims, 14 Drawing Sheets

(56) References Cited

U.S. PATENT DOCUMENTS

| | | |
|---|---|---|
| 6,887,738 B2 | 5/2005 | Shintani |
| 6,986,669 B2 * | 1/2006 | Kawai .............................. 439/66 |
| 6,993,826 B2 * | 2/2006 | Takahashi et al. ......... 29/603.12 |
| 7,166,513 B2 * | 1/2007 | Hsu et al. ...................... 438/267 |
| 7,553,750 B2 | 6/2009 | Shih |
| 7,745,725 B2 * | 6/2010 | Paterek et al. ............. 174/50.52 |
| 7,919,357 B2 * | 4/2011 | Sawada et al. ................ 438/108 |
| 8,143,109 B2 * | 3/2012 | Yan ................................ 438/125 |
| 8,344,367 B2 * | 1/2013 | Kim et al. ....................... 257/40 |
| 8,384,121 B2 * | 2/2013 | Tischler et al. .................. 257/99 |
| 8,466,488 B2 * | 6/2013 | Tischler et al. .................. 257/99 |
| 2007/0017699 A1 * | 1/2007 | Ishimoto et al. ............... 174/260 |
| 2007/0126126 A1 | 6/2007 | Kim et al. |
| 2012/0007232 A1 * | 1/2012 | Haba ............................ 257/737 |
| 2012/0032898 A1 * | 2/2012 | Li et al. ........................ 345/173 |
| 2012/0037966 A1 * | 2/2012 | Yamaguchi et al. ........... 257/288 |
| 2012/0043672 A1 * | 2/2012 | Cho et al. ...................... 257/778 |
| 2013/0020709 A1 * | 1/2013 | Huang et al. .................. 257/762 |
| 2013/0099376 A1 * | 4/2013 | Haba ............................ 257/737 |
| 2013/0112989 A1 * | 5/2013 | Tischler et al. .................. 257/76 |

\* cited by examiner

SEMICONDUCTOR DEVICE WITH CONDUCTIVE LAYER OVER SUBSTRATE WITH VENTS TO CHANNEL BUMP MATERIAL AND REDUCE INTERCONNECT VOIDS

FIELD OF THE INVENTION

The present invention relates in general to semiconductor devices and, more particularly, to a semiconductor device and method of forming a conductive layer over a substrate with vents to channel bump material and reduce interconnect voids.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term ""semiconductor die"" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a shows a substrate 10 with conductive traces 12, 14, and 16 formed on a surface of the substrate. Conductive trace 16 includes a wider interconnect site 18. In FIG. 1b, a photoresist layer 20 is formed over the surface of substrate 10 and conductive traces 12-16. A portion of photoresist layer 20 is removed to expose interconnect site 18. Semiconductor die 22 has a contact pad 24 formed over an active surface of the semiconductor die. A bump 26 is formed over contact pad 24. Semiconductor die 22 is mounted to substrate 10 with bump 26 metallurgically and electrically connected to interconnect site 18.

FIG. 2a shows a substrate 30 with conductive traces 32, 34, and 36 formed on a surface of the substrate. Conductive trace 36 includes a wider, circular interconnect site 38. In FIG. 2b, a photoresist layer 40 is formed over the surface of substrate 30 and conductive traces 32-36. A portion of photoresist layer 40 is removed to expose interconnect site 38. Semiconductor die 42 has a contact pad 44 formed over an active surface of the semiconductor die. A bump 46 is formed over contact pad 44. Semiconductor die 42 is mounted to substrate 30 with bump 46 metallurgically and electrically connected to interconnect site 38.

In each case, the interconnection between the bump and interconnect site is susceptible to interconnect voids, shown in FIG. 2b as void 48. The voids reduce the interconnect reliability and can cause manufacturing defects and latent defects.

SUMMARY OF THE INVENTION

A need exists to reduce interconnect voids between the semiconductor die bump and interconnect site on the substrate. Accordingly, in one embodiment, the present invention is a method of making a semiconductor device comprising the steps of providing a semiconductor die having a plurality of bumps formed over a surface of the semiconductor die, providing a substrate, forming a first conductive layer having first and second segments over a surface of the substrate with a first vent separating an end of the first segment and the second segment and a second vent separating an end of the second segment and the first segment, forming a second conductive layer over the surface of the substrate to electrically connect the first segment and second segment of the first conductive layer, and mounting the semiconductor die to the substrate with the bumps aligned to the first segment and second segment of the first conductive layer. Bump material from reflow of the bumps is channeled into the first vent and second vent to reduce interconnect void formation.

In another embodiment, the present invention is a method of making a semiconductor device comprising the steps of providing a semiconductor die, providing a substrate, forming a first conductive layer having first and second segments over a surface of the substrate with a vent separating the first segment and the second segment, and mounting the semiconductor die to the substrate with bump material channeled into the vent.

In another embodiment, the present invention is a method of making a semiconductor device comprising the steps of providing a substrate, and forming a first conductive layer having first and second segments over a surface of the substrate with a vent separating the first segment and the second segment.

In another embodiment, the present invention is a semiconductor device comprising a substrate and first conductive layer having first and second segments formed over a surface of the substrate with a vent separating the first segment and the second segment.

DETAILED DESCRIPTION OF THE DRAWINGS

Figure 1A:
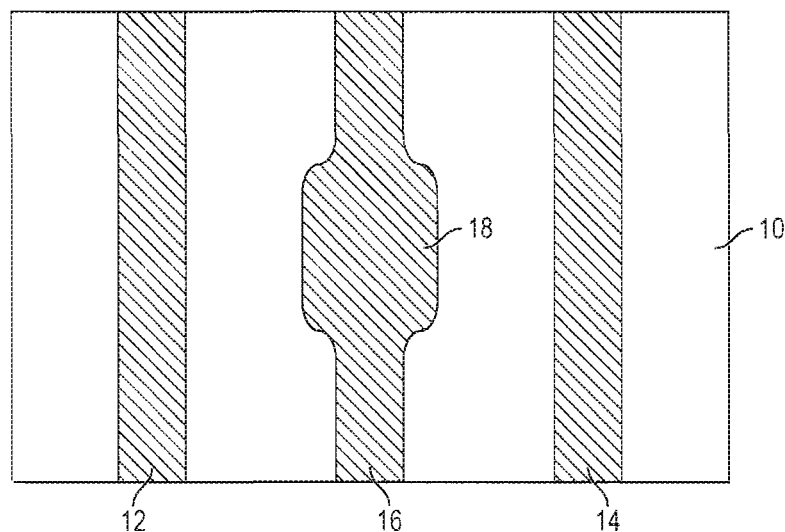
FIGS. 1a-1b illustrate a conventional semiconductor die mounted to a conductive layer formed over a substrate.
Figure 1B:
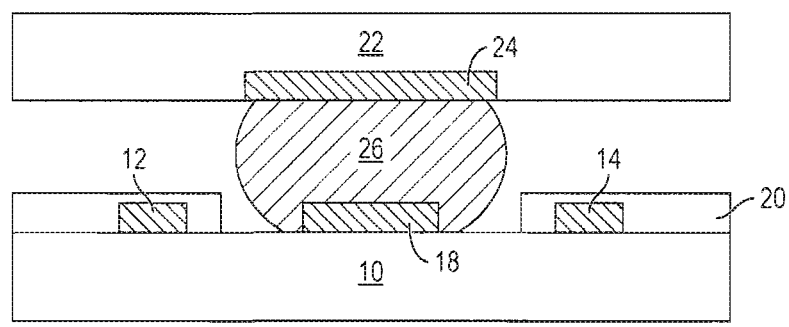
Figure 2A:
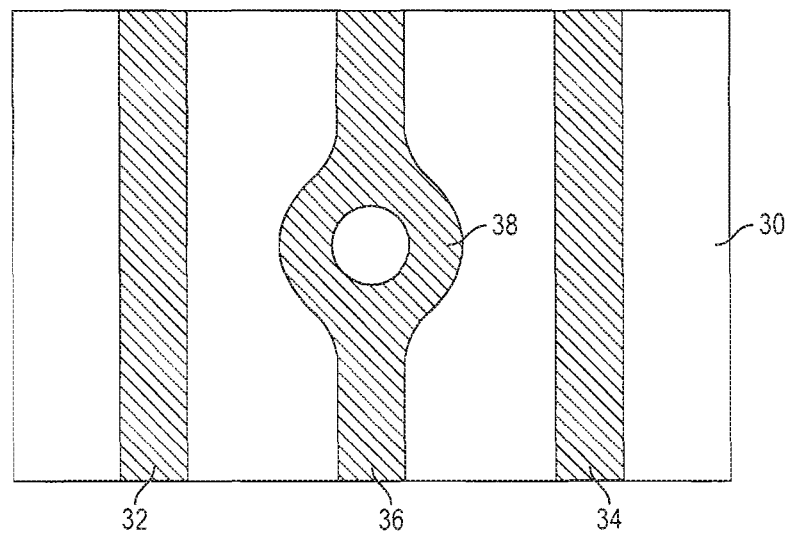
FIGS. 2a-2b illustrate a conventional semiconductor die mounted to a circular conductive layer formed over a substrate.
Figure 2B:
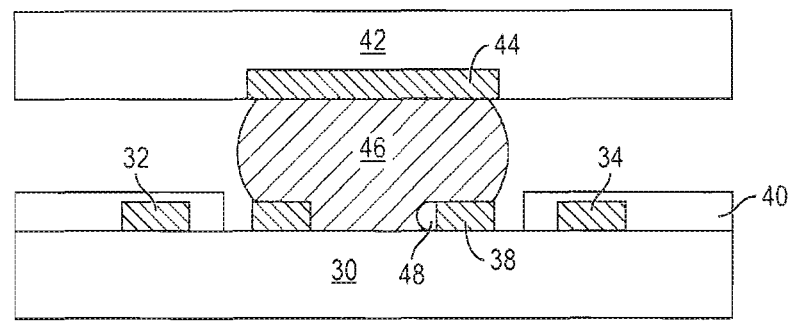

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
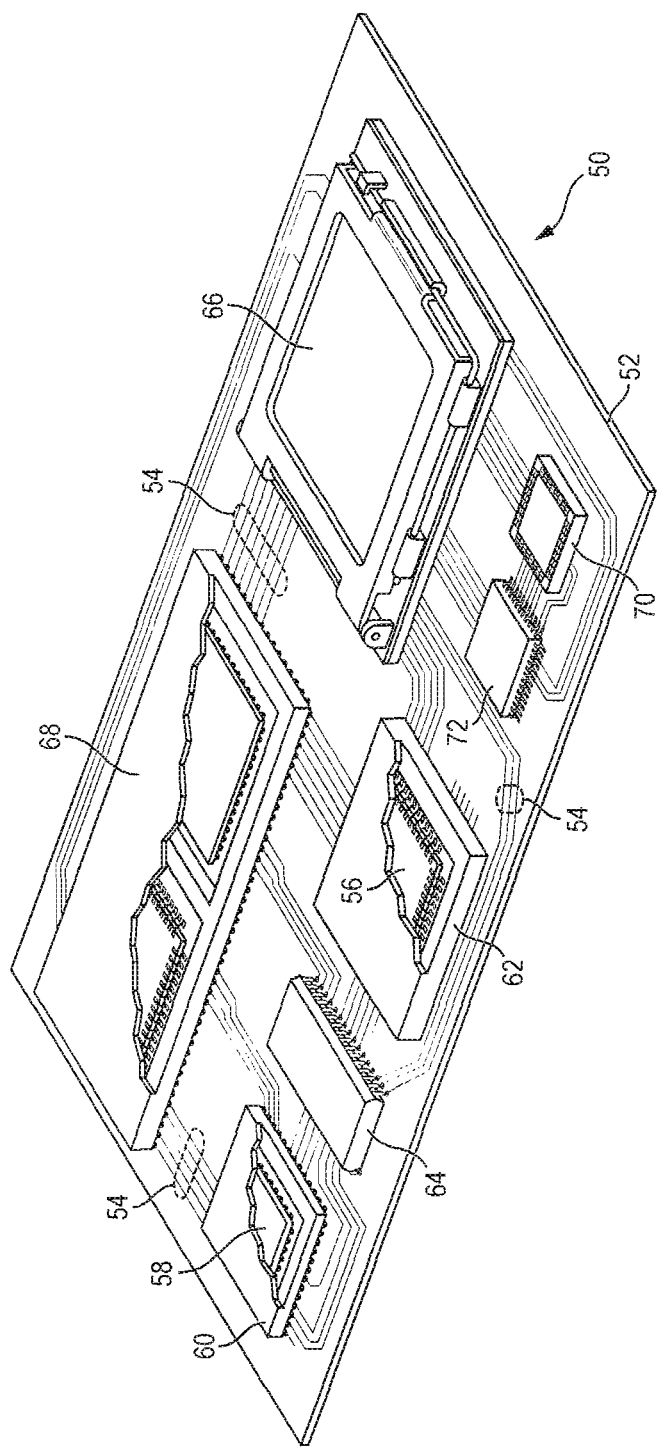
FIG. 3 illustrates a printed circuit board with different types of packages mounted to its surface.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 4A:
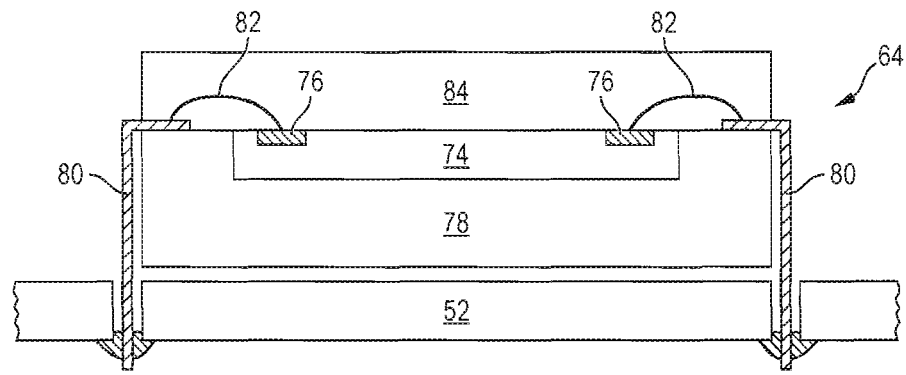
FIGS. 4a-4c illustrate further detail of the representative semiconductor packages mounted to the printed circuit board.
Figure 4B:
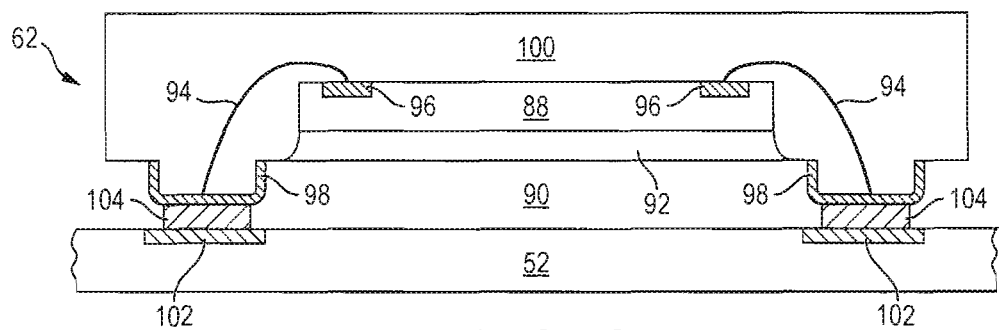
Figure 4C:
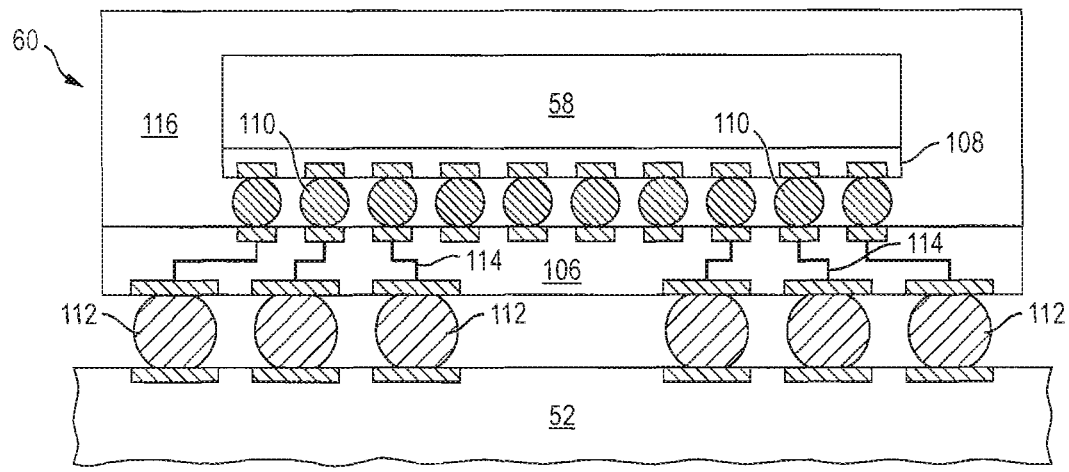

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
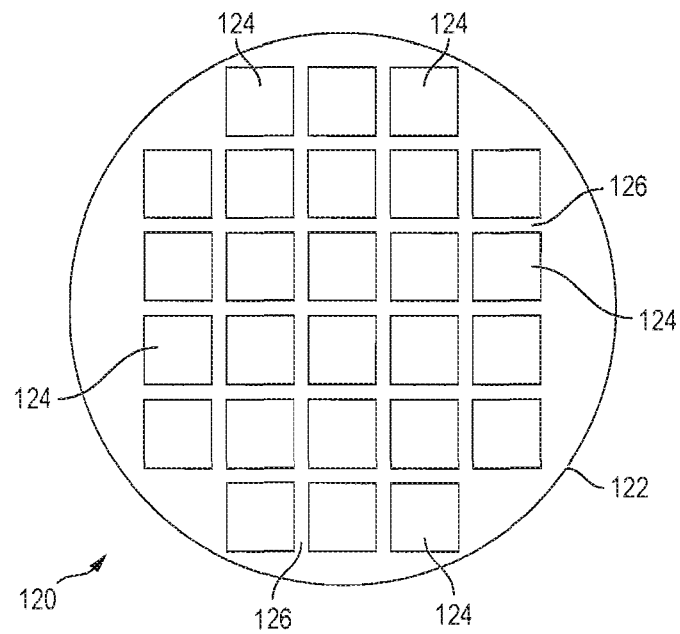
FIGS. 5a-5d illustrate a semiconductor wafer with a plurality of semiconductor die separated by a saw street.

FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 5B:
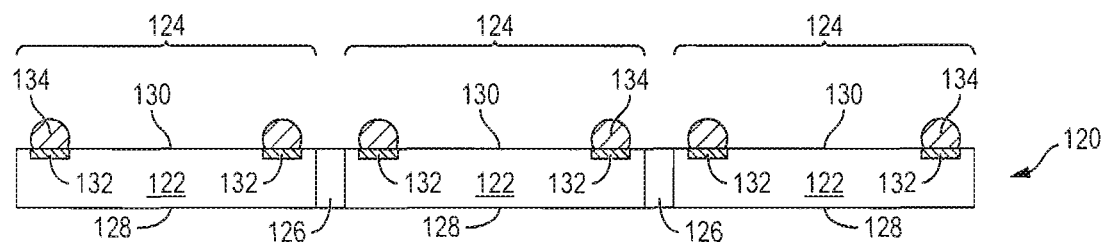

FIG. 5b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 5b. Alternatively, conductive layer 132 can be offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132. Bumps 134 can also be compression bonded to conductive layer 132. Bumps 134 represent one type of interconnect structure that can be formed over conductive layer 132. The interconnect structure can also use stud bump, micro bump, or other electrical interconnect.

Figure 5C:
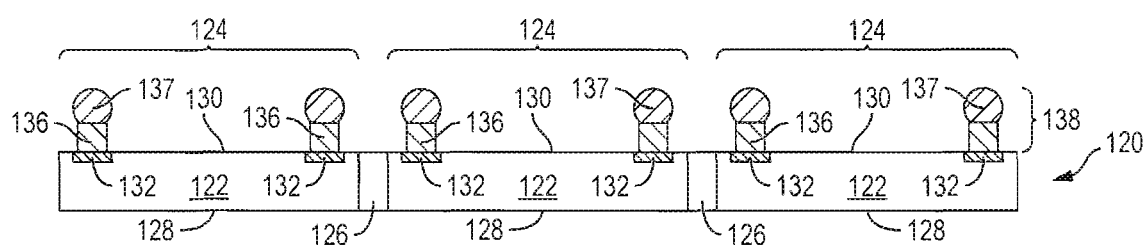

In another embodiment, conductive pillars 136 are formed over conductive layer 132 and bumps 137 are formed over conductive pillars 136, as shown in FIG. 5c. The combination of conductive pillars 136 and bumps 137 constitute composite interconnect structure 138 having a non-fusible portion (conductive pillars 136) and fusible portion (bumps 137).

Figure 5D:
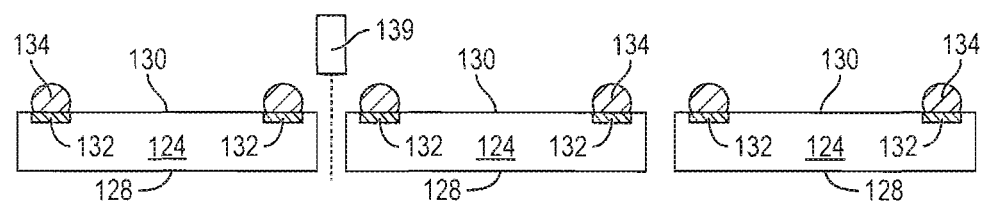

In FIG. 5d, semiconductor wafer 120 is singulated saw street 126 with saw blade or laser cutting tool 139 into individual semiconductor die 124.

Figure 6A:
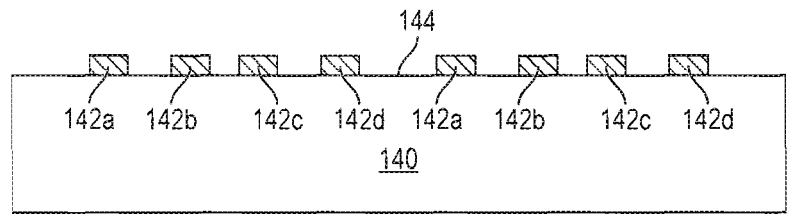
FIGS. 6a-6g illustrate a process of forming a conductive layer and conductive bridge over a substrate with vents to channel bump material and reduce interconnect voids.

FIGS. 6a-6g illustrate, in relation to FIGS. 3 and 4a-4c, a process of forming a conductive layer and conductive bridge over a substrate with vents to channel bump material and reduce interconnect voids. FIG. 6a shows a substrate or PCB 140 suitable for mounting semiconductor die 124. Substrate 140 can be can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 140 contains one or more laminated insulating or dielectric layers.

An electrically conductive layer 142 is formed over surface 144 of substrate 140 using a patterning and metal deposition process, such as silk screen printing, photoengraving, PCB milling, electroless plating, or electroplating process. Conductive layer 142 can be one or more layers of Al, Cu, Sn, Ni, Au, Ag, or other suitable electrically conductive material. Conductive layer 142 is formed as a plurality of conductive segments 142a-142d operating as conductive traces and contacts pads for electrical interconnect. In one embodiment, conductive layer 142a-142d each have a width of 5-50 micrometers (μm) and pitch of 5-50 μm. Conductive layer 142a-142d is electrically common or electrically isolated according to the design and function of semiconductor die 124.

Figure 6B:
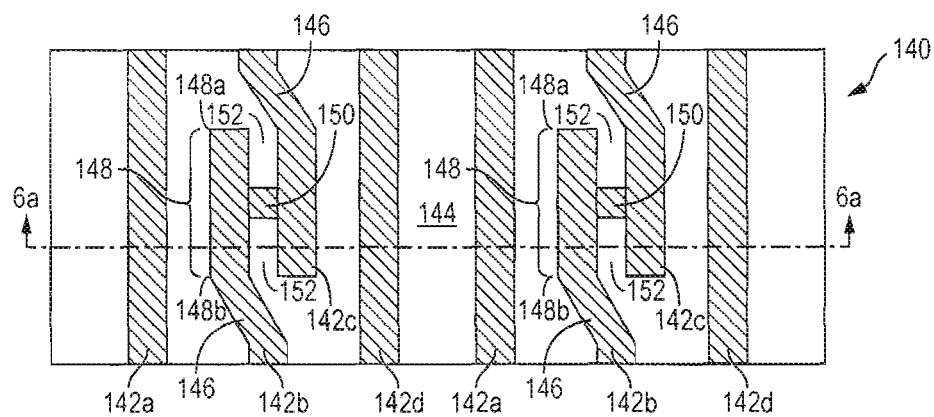

FIG. 6b shows a plan view of conductive layer 142a-142d formed over surface 144 of substrate 140. In particular, conductive layer 142b and 142c include respective routing redirection or line jogs at locations 146 so that conductive layer 142b and 142c run parallel along line segment 148. Conductive layer 142b and 142c respectively terminate at opposing ends 148a and 148b of line segment 148.

An electrically conductive layer 150 is formed over surface 144 of substrate 140 using a patterning and metal deposition process, such as silk screen printing, photoengraving, PCB milling, electroless plating, or electroplating process. Conductive layer 150 can be one or more layers of Al, Cu, Sn, Ni, Au, Ag, or other suitable electrically conductive material. Conductive layer 150 operates as a conductive bridge to electrically connect conductive layer 142b and 142c. The redirected routing of conductive layer 142b and 142c with conductive bridge layer 150 creates vents 152 extending from conductive bridge layer 150 to opposing ends 148a and 148b of line segment 148.

Figure 6C:
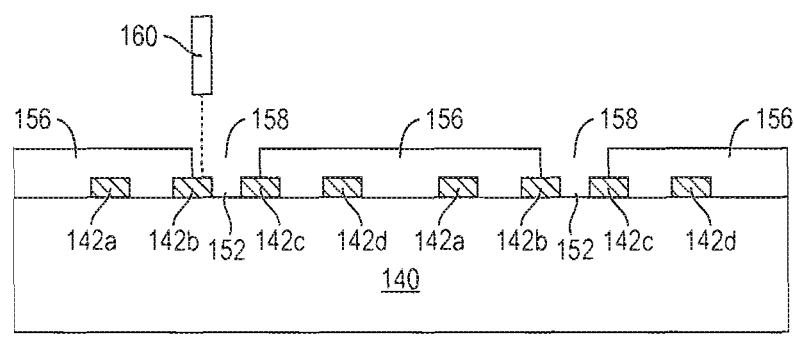
Figure 6D:
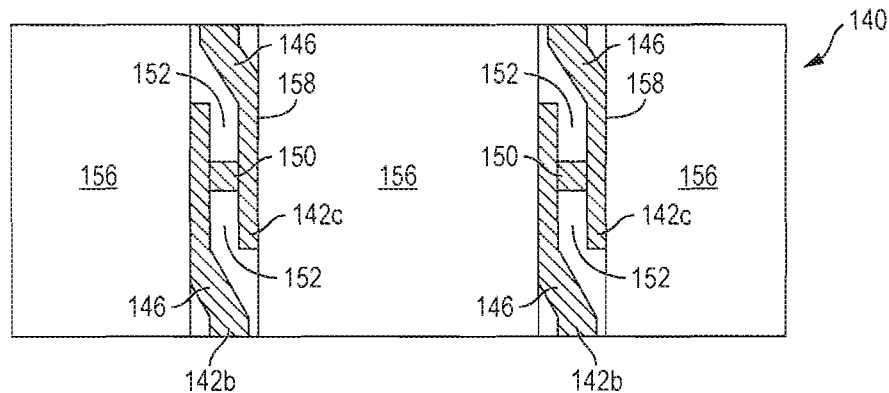

In FIG. 6c, a patterning or photoresist layer 156 is formed over substrate 140 and conductive layer 142 using printing, spin coating, or spray coating. In one embodiment, patterning layer 156 is a dry film photoresist lamination with a thickness of 10-100 μm. In other embodiments that utilize an insulating layer for patterning, the insulating layer can include one or more layers of SiO2, Si3N4, SiON, Ta2O5, Al2O3, or other material having similar structural properties. A portion of photoresist layer 156 is removed by an etching process to form openings 158 and partially expose conductive layer 142b and 142c and fully expose conductive bridge layer 150. Alternatively, openings 158 are formed by laser direct ablation (LDA) using laser 160. FIG. 6d shows a plan view of photoresist layer 156 formed over substrate 140 and conductive layer 142 with openings 158 partially exposing conductive layer 142b and 142c and fully expose conductive bridge layer 150.

Figure 6E:
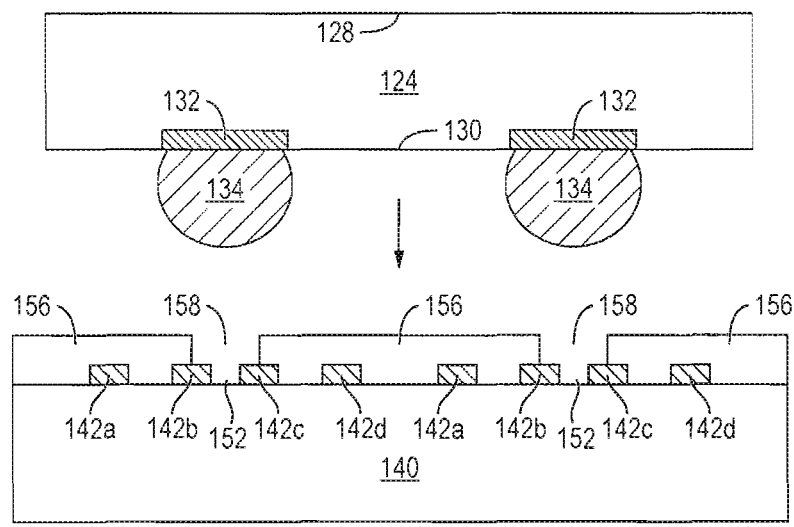
Figure 6F:
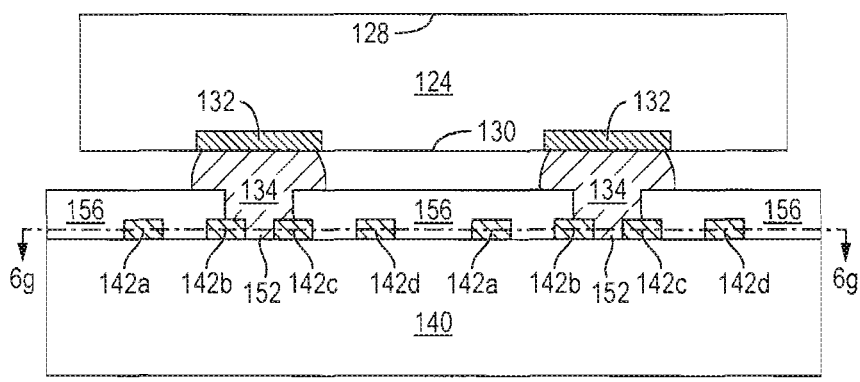
Figure 6G:
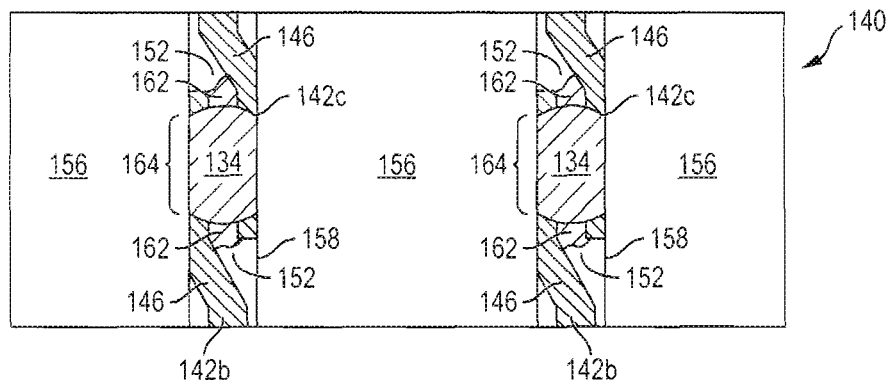

In FIG. 6e, semiconductor die 124 from FIGS. 5a-5d is positioned over and mounted to substrate 140 using a pick and place operation with active surface 130 oriented toward the substrate and bumps 134 aligned with conductive layer 142b-142c and centered over conductive bridge layer 150. Semiconductor die 124 may contain composite interconnect structures 138, as shown in FIG. 5c. Bumps 134 are reflowed and semiconductor die 124 is pressed onto substrate 140. FIG. 6f shows semiconductor die 124 mounted to substrate 140 with bumps 134 electrically and metallurgically connected to conductive layer 142b and 142c and conductive bridge layer 150 in a bump on lead (BOL) configuration. In particular, during reflow of bumps 134 and pressing semiconductor die 124 onto substrate 140, bump material 162 from the reflowed bumps 134 is channeled through vents 152 away from interconnect site 164, as show in FIG. 6g. Channeling bump material 162 through vents 152 away from interconnect site 164 reduces interconnect voids between bumps 134 and conductive layer 142b and 142c and conductive bridge layer 150. In addition, the routing of conductive layer 142b and 142c with conductive bridge layer 150 increases the contact area between bumps 134 and interconnect site 164 for greater joint reliability.

Figure 7A:
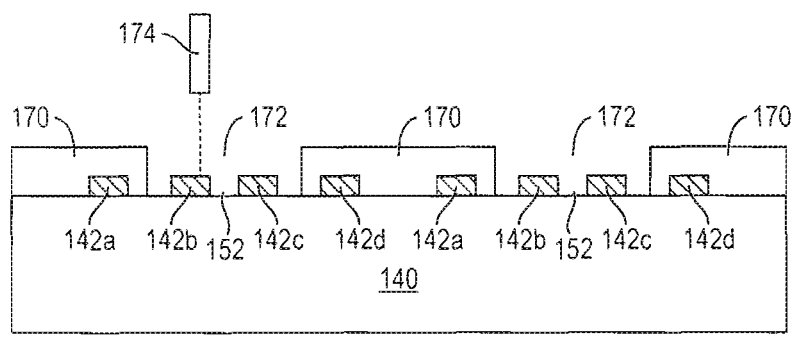
FIGS. 7a-7e illustrate a process of forming a photoresist layer to fully expose the interconnect conductive layer and conductive bridge.
Figure 7B:
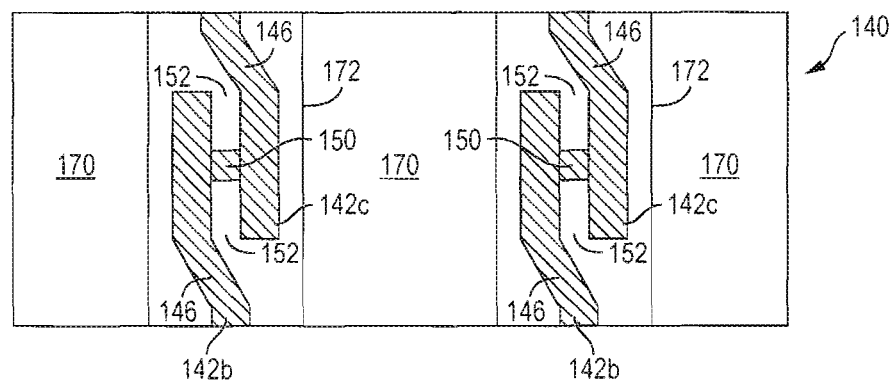

In another embodiment, continuing from FIG. 6b, a patterning or photoresist layer 170 is formed over substrate 140 and conductive layer 142 using printing, spin coating, or spray coating, as shown in FIG. 7a. In one embodiment, patterning layer 170 is a dry film photoresist lamination with a thickness of 10-100 μm. In other embodiments that utilize an insulating layer for patterning, the insulating layer can include one or more layers of SiO2, Si3N4, SiON, Ta2O5, Al2O3, or other material having similar structural properties. A portion of photoresist layer 170 is removed by an etching process to form openings 172 and fully expose conductive layer 142b and 142c and conductive bridge layer 150. Alternatively, openings 172 are formed by LDA using laser 174. FIG. 7b shows a plan view of photoresist layer 170 formed over substrate 140 and conductive layer 142 with openings 172 fully exposing conductive layer 142b and 142c and conductive bridge layer 150.

Figure 7C:
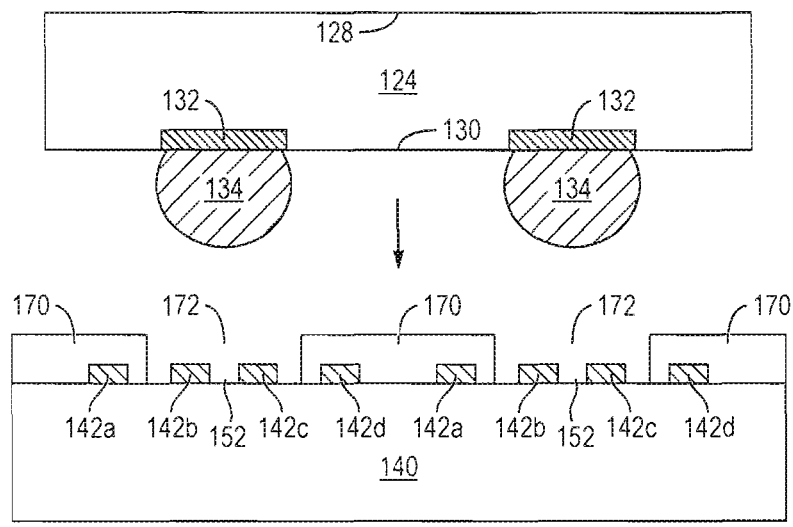
Figure 7D:
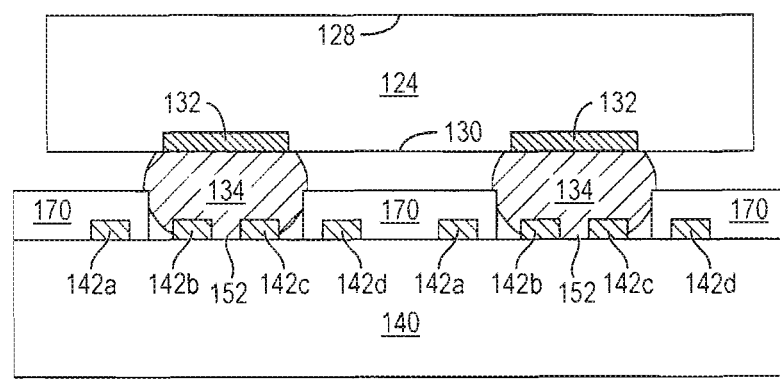
Figure 7E:
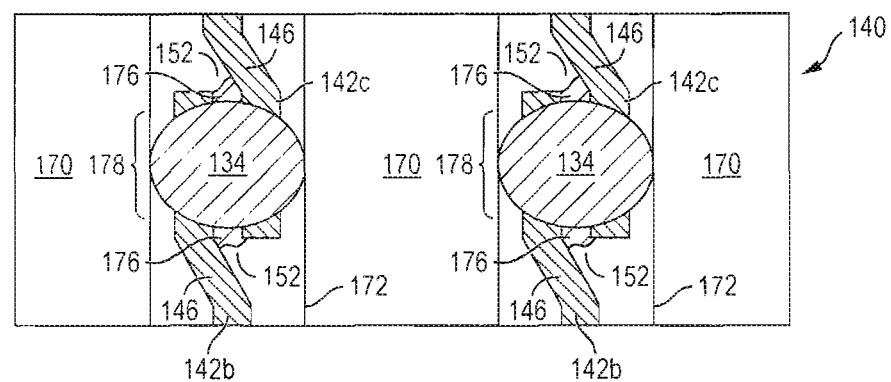

In FIG. 7c, semiconductor die 124 from FIGS. 5a-5d is positioned over and mounted to substrate 140 using a pick and place operation with active surface 130 oriented toward the substrate and bumps 134 aligned with conductive layer 142b-142c and centered over conductive bridge layer 150. Semiconductor die 124 may contain composite interconnect structures 138, as shown in FIG. 5c. Bumps 134 are reflowed and semiconductor die 124 is pressed onto substrate 140. FIG. 7d shows semiconductor die 124 mounted to substrate 140 with bumps 134 electrically and metallurgically connected to conductive layer 142b and 142c and conductive bridge layer 150 in a BOL configuration. In particular, during reflow of bumps 134 and pressing semiconductor die 124 onto substrate 140, bump material 176 from the reflowed bumps 134 is channeled through vents 152 away from interconnect site 178, as show in FIG. 7e. Channeling bump material 176 through vents 152 away from interconnect site 178 reduces interconnect voids between bumps 134 and conductive layer 142b and 142c and conductive bridge layer 150. In addition, the routing of conductive layer 142b and 142c with conductive bridge layer 150 increases the contact area between bumps 134 and interconnect site 178 for greater joint reliability.

Figure 8A:
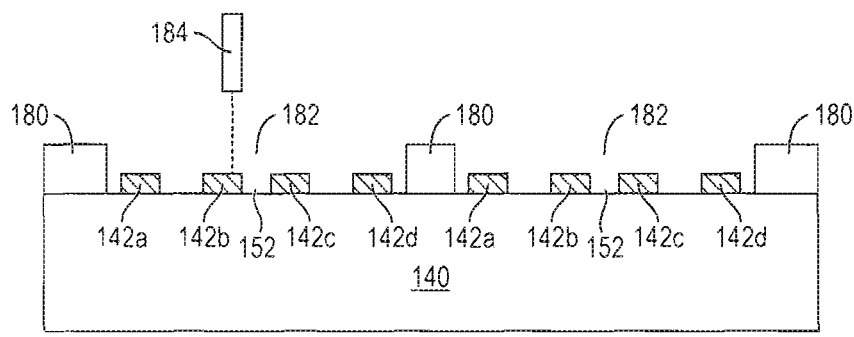
FIGS. 8a-8e illustrate a process of forming a photoresist layer to fully expose all conductive layers and the conductive bridge.
Figure 8B:
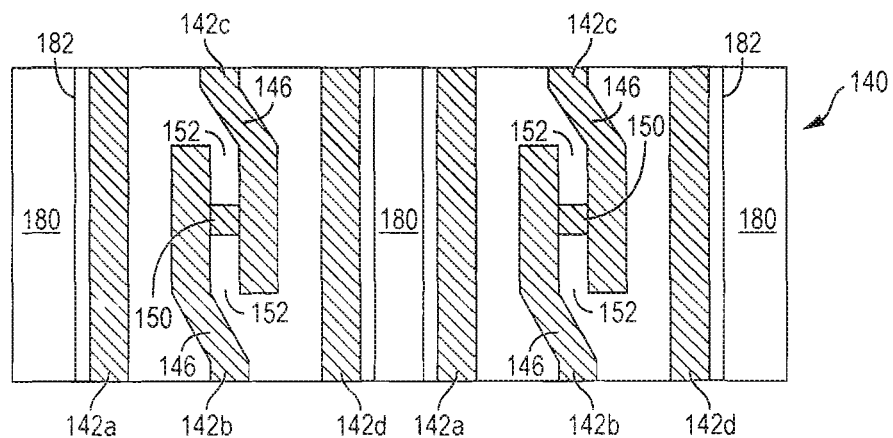

In another embodiment, continuing from FIG. 6b, a patterning or photoresist layer 180 is formed over substrate 140 and conductive layer 142 using printing, spin coating, or spray coating, as shown in FIG. 8a. In one embodiment, patterning layer 180 is a dry film photoresist lamination with a thickness of 10-100 μm. In other embodiments that utilize an insulating layer for patterning, the insulating layer can include one or more layers of SiO2, Si3N4, SiON, Ta2O5, Al2O3, or other material having similar structural properties. A portion of photoresist layer 180 is removed by an etching process to form openings 182 and fully expose conductive layer 142a-142d and conductive bridge layer 150. Alternatively, openings 182 are formed by LDA using laser 184. FIG. 8b shows a plan view of photoresist layer 180 formed over substrate 140 and conductive layer 142 with openings 182 fully exposing conductive layer 142a-142d and conductive bridge layer 150.

Figure 8C:
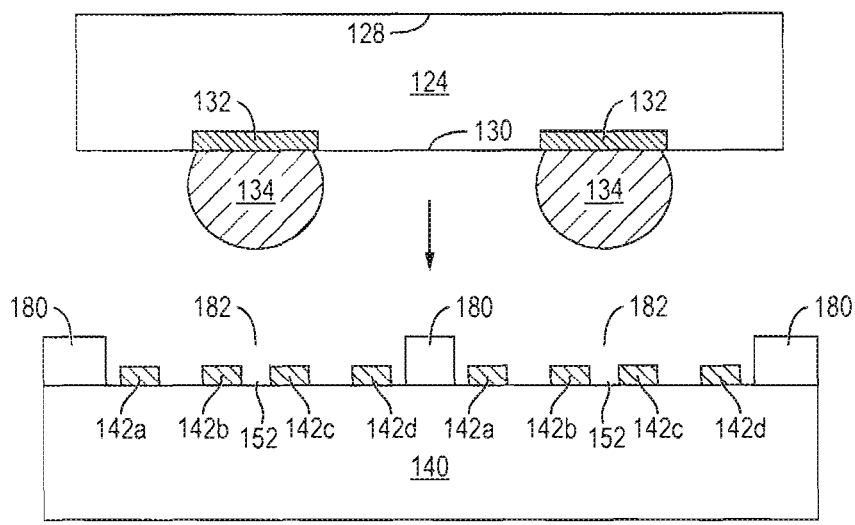
Figure 8D:
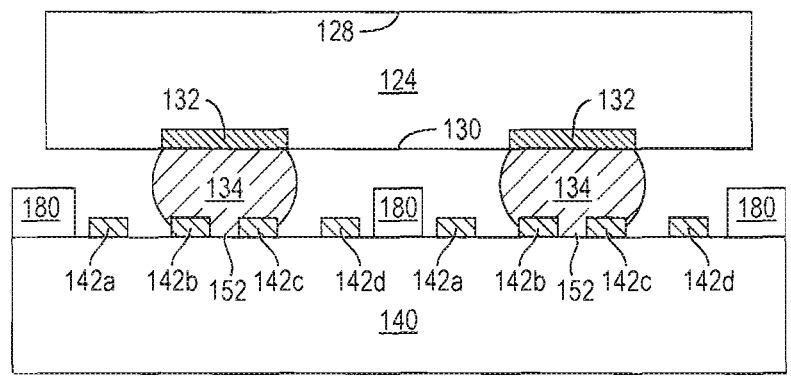
Figure 8E:
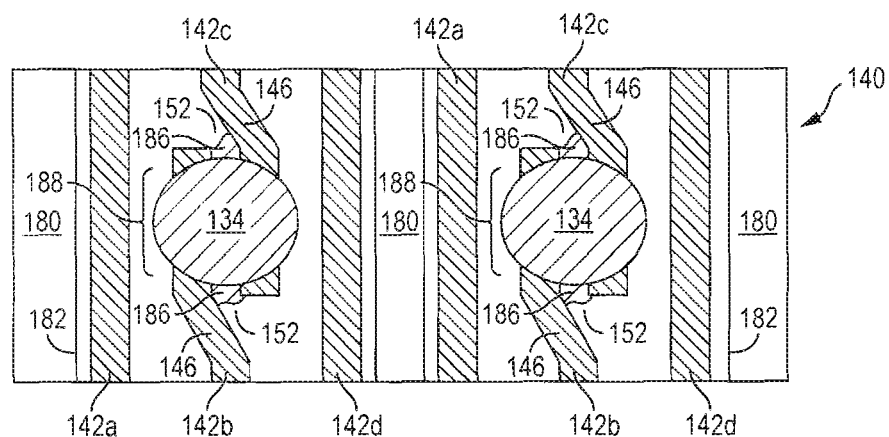

In FIG. 8c, semiconductor die 124 from FIGS. 5a-5d is positioned over and mounted to substrate 140 using a pick and place operation with active surface 130 oriented toward the substrate and bumps 134 aligned with conductive layer 142b-142c and centered over conductive bridge layer 150. Semiconductor die 124 may contain composite interconnect structures 138, as shown in FIG. 5c. Bumps 134 are reflowed and semiconductor die 124 is pressed onto substrate 140. FIG. 8d shows semiconductor die 124 mounted to substrate 140 with bumps 134 electrically and metallurgically connected to conductive layer 142b and 142c and conductive bridge layer 150 in a BOL configuration. In particular, during reflow of bumps 134 and pressing semiconductor die 124 onto substrate 140, bump material 186 from the reflowed bumps 134 is channeled through vents 152 away from interconnect site 188, as show in FIG. 8e. Channeling bump material 186 through vents 152 away from interconnect site 188 reduces interconnect voids between bumps 134 and conductive layer 142b and 142c and conductive bridge layer 150. In addition, the routing of conductive layer 142b and 142c with conductive bridge layer 150 increases the contact area between bumps 134 and interconnect site 188 for greater joint reliability.

Figure 9A:
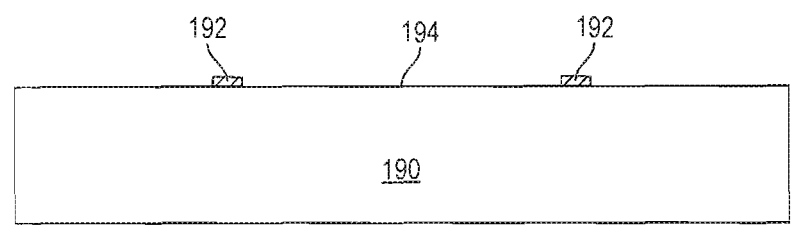
FIGS. 9a-9h illustrate a process of forming conductive layers of different thickness over a substrate to form vents to channel bump material and reduce interconnect voids.

FIGS. 9a-9h illustrate, in relation to FIGS. 3 and 4a-4c, a process of forming conductive layers of different thickness over a substrate to form vents to channel bump material and reduce interconnect voids. FIG. 9a shows a substrate or PCB 190 suitable for mounting semiconductor die 124. Substrate 190 can be can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Alternatively, substrate 190 contains one or more laminated insulating or dielectric layers.

An electrically conductive layer 192 is formed over surface 194 of substrate 190 using a patterning and metal deposition process, such as silk screen printing, photoengraving, PCB milling, electroless plating, or electroplating process. Conductive layer 192 can be one or more layers of Al, Cu, Sn, Ni, Au, Ag, or other suitable electrically conductive material. In one embodiment, conductive layer 192 has a thickness of 1-20 μm.

Figure 9B:
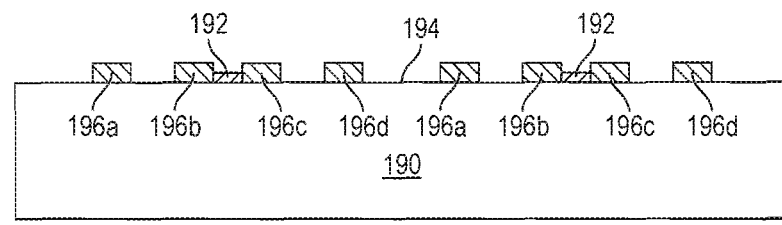

In FIG. 9b, an electrically conductive layer 196 is formed over surface 194 of substrate 190 using a patterning and metal deposition process, such as silk screen printing, photoengraving, PCB milling, electroless plating, or electroplating process. Conductive layer 196 can be one or more layers of Al, Cu, Sn, Ni, Au, Ag, or other suitable electrically conductive material. Conductive layer 196 is formed as a plurality of conductive segments 196a-196d operating as conductive traces and contacts pads for electrical interconnect. In one embodiment, conductive layer 196a-196d each have a width of 5-50 μm and thickness of 2-50 μm. The thickness of conductive layer 196 is greater than the thickness of conductive layer 192. Conductive layer 196a-196d is electrically common or electrically isolated according to the design and function of semiconductor die 124.

Figure 9C:
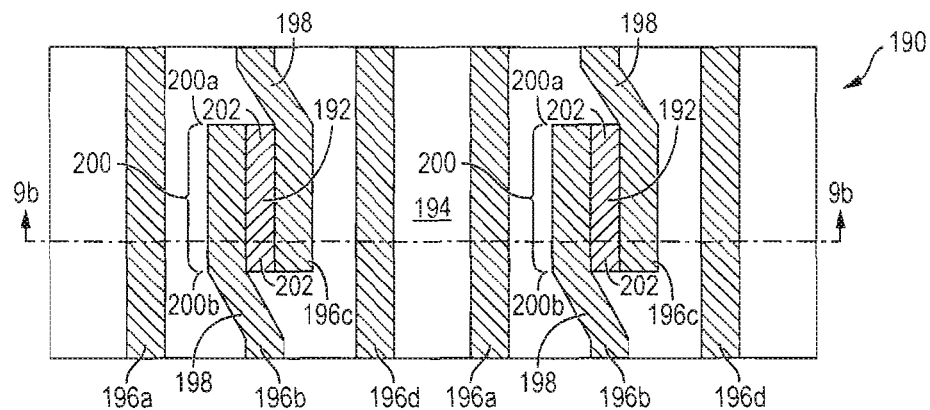

FIG. 9c shows a plan view of conductive layer 192 and conductive layer 196a-196d formed over surface 194 of substrate 190. In particular, conductive layer 196b and 196c include respective routing redirection or line jogs at locations 198 so that conductive layer 196b and 196c run parallel along line segment 200. Conductive layer 196b and 196c respectively terminate at opposing ends 200a and 200b of line segment 200. Conductive layer 196b and 196c are electrically connected by conductive layer 192. The redirected routing of conductive layer 196b and 196c with the thickness of conductive layer 192 being less than the thickness of conductive layer 196 creates vents 202 extending to opposing ends 200a and 200b of line segment 200.

Figure 9D:
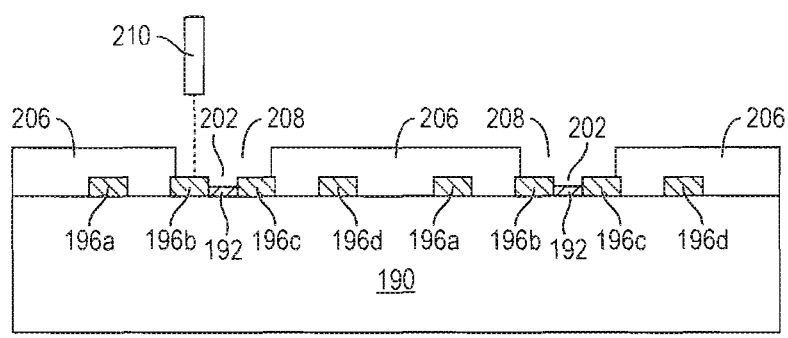
Figure 9E:
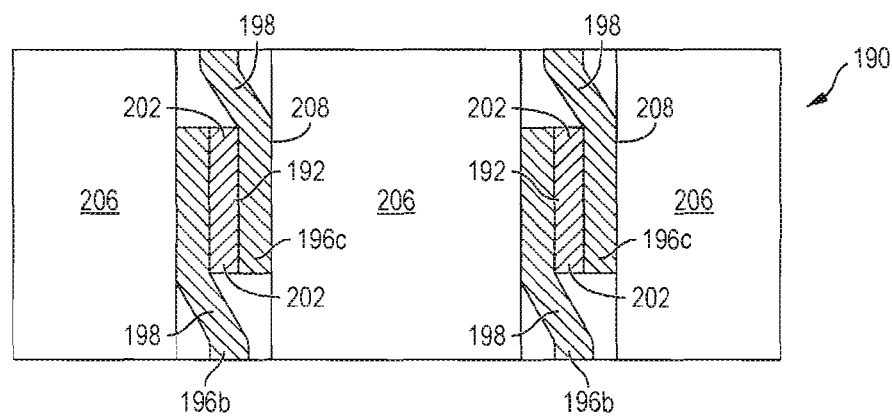

In FIG. 9d, a patterning or photoresist layer 206 is formed over substrate 190 and conductive layers 192 and 196 using printing, spin coating, or spray coating. In one embodiment, patterning layer 206 is a dry film photoresist lamination with a thickness of 10-100 μm. In other embodiments that utilize an insulating layer for patterning, the insulating layer can include one or more layers of SiO2, Si3N4, SiON, Ta2O5, Al2O3, or other material having similar structural properties. A portion of photoresist layer 206 is removed by an etching process to form openings 208 and partially expose conductive layer 196b and 196c and fully expose conductive layer 192. Alternatively, openings 208 are formed by LDA using laser 210. FIG. 9e shows a plan view of photoresist layer 206 formed over substrate 190 and conductive layer 196 with openings 208 partially exposing conductive layer 196b and 196c and fully expose conductive layer 192.

Figure 9F:
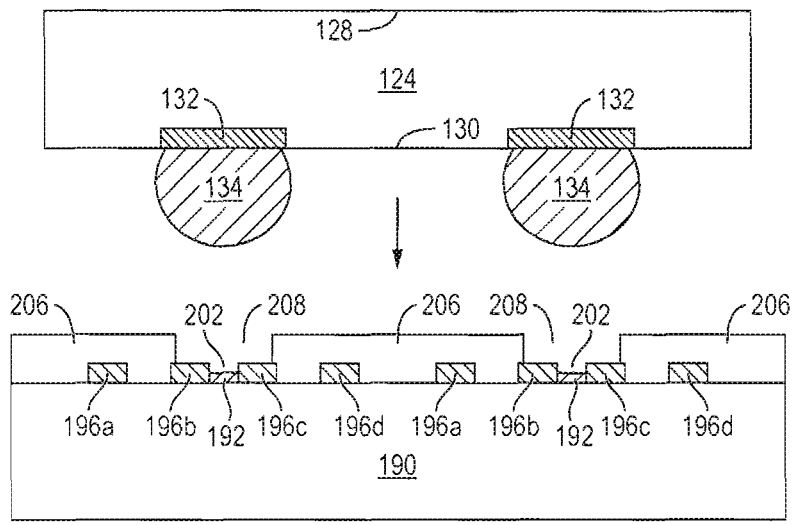
Figure 9G:
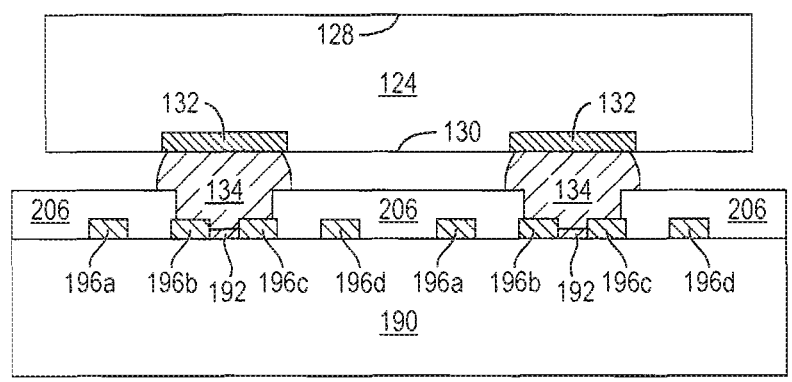
Figure 9H:
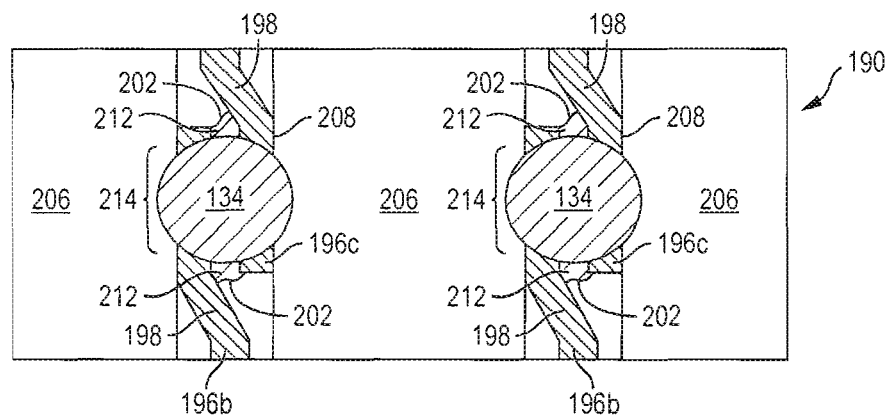

In FIG. 9f, semiconductor die 124 from FIGS. 5a-5d is positioned over and mounted to substrate 190 using a pick and place operation with active surface 130 oriented toward the substrate and bumps 134 aligned with conductive layer 196b-196c and centered over conductive layer 192. Semiconductor die 124 may contain composite interconnect structures 138, as shown in FIG. 5c. Bumps 134 are reflowed and semiconductor die 124 is pressed onto substrate 190. FIG. 9g shows semiconductor die 124 mounted to substrate 190 with bumps 134 electrically and metallurgically connected to conductive layer 196b and 196c and conductive layer 192 in a BOL configuration. In particular, during reflow of bumps 134 and pressing semiconductor die 124 onto substrate 190, bump material 212 from the reflowed bumps 134 is channeled through vents 202 away from interconnect site 214, as show in FIG. 9h. Channeling bump material 212 through vents 202 away from interconnect site 214 reduces interconnect voids between bumps 134 and conductive layer 196b and 196c and conductive layer 192. In addition, the routing of conductive layer 196b and 196c with the lesser thickness of conductive layer 192 increases the contact area between bumps 134 and interconnect site 214 for greater joint reliability.

Figure 10:
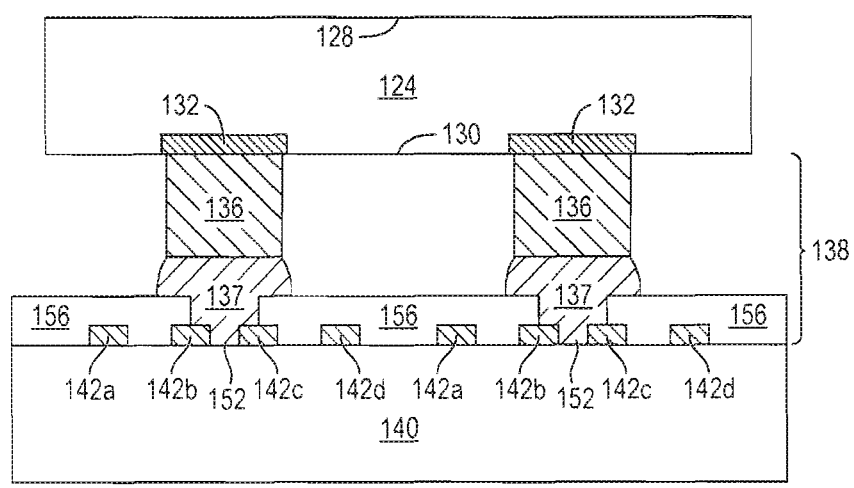
FIG. 10 illustrates a semiconductor die with composite interconnect structures mounted to a conductive layer on a substrate with vents to channel bump material.

FIG. 10 shows an embodiment with semiconductor die 124 from FIG. 5c mounted to substrate 140 using a pick and place operation with active surface 130 oriented toward the substrate and composite interconnect structures 138 aligned with conductive layer 142b-142c and centered over conductive bridge layer 150. Bumps 137 are reflowed and semiconductor die 124 is pressed onto substrate 140 to electrically and metallurgically connect the bumps to conductive layer 142b and 142c and conductive bridge layer 150 in a BOL configuration. In particular, during reflow of bumps 137 and pressing semiconductor die 124 onto substrate 140, bump material from the reflowed bumps 137 is channeled through vents 152 away from the interconnect site, similar to FIG. 6g. Channeling the bump material through vents 152 reduces interconnect voids between bumps 137 and conductive layer 142b and 142c and conductive bridge layer 150.

In summary, semiconductor die 124 has a plurality of bumps 134 formed over active surface 130 of the semiconductor die. Conductive layer 142 has segments 142b and 142c formed over surface 144 of substrate 140 with vents 152 separating an end of segment 142b and segment 142c and further separating an end of segment 142c segment 142b. Conductive layer 150 is formed over surface 144 of substrate 140 to electrically connect segment 142b and segment 142c. The thickness of conductive layer 192 is less than a thickness of conductive layer 196. A patterning layer 156 is formed over surface 144 of substrate 140 and conductive layer 142. A portion of patterning layer 156 is removed by LDA to expose segment 142b and segment 142c. Semiconductor die 124 is mounted to substrate 140 with bumps 134 aligned to segment 142b and segment 142c. Bump material from reflow of bumps 134 is channeled into vents 152 to reduce interconnect void formation.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die including an interconnect structure formed over a surface of the semiconductor die;
    providing a substrate;
    forming a first conductive layer over a surface of the substrate with a vent separating a first segment of the first conductive layer from a second segment of the first conductive layer; and
    disposing the semiconductor die over the substrate including a portion of the interconnect structure channeled into the vent.

2. The method of claim 1, wherein the portion of the interconnect structure channeled into the vent reduces interconnect void formation.

3. The method of claim 1, further including forming a second conductive layer over the surface of the substrate between the first segment and second segment of the first conductive layer.

4. The method of claim 3, wherein a thickness of the second conductive layer is less than a thickness of the first conductive layer.

5. The method of claim 1, further including:
    forming a patterning layer over the surface of the substrate and the first conductive layer; and
    forming an opening in the patterning layer over the first segment and second segment of the first conductive layer.

6. The method of claim 5, further including forming the opening in the patterning layer by laser direct ablation.

7. A method of making a semiconductor device, comprising:
    providing a substrate;
    forming a first conductive layer over the substrate with a vent separating a first segment of the first conductive layer from a second segment of the first conductive layer; and
    forming a second conductive layer between the first segment and second segment of the first conductive layer.

8. The method of claim 7, further including:
    providing a semiconductor die;
    disposing the semiconductor die over the substrate; and
    channeling a bump material into the vent.

9. The method of claim 8, wherein the bump material channeled into the vent reduces interconnect void formation.

10. The method of claim 7, wherein the second conductive layer extends along a length of the first segment and second segment of the first conductive layer and a thickness of the second conductive layer is less than a thickness of the first conductive layer.

11. The method of claim 7, further including:
    forming a patterning layer over the substrate and the first conductive layer; and
    forming an opening in the patterning layer over the first segment and second segment of the first conductive layer.

12. The method of claim 11, further including forming the opening in the patterning layer by laser direct ablation.

13. A semiconductor device, comprising:
    a substrate; and
    a conductive layer formed over a surface of the substrate and including adjacent first and second segments connected by a conductive bridge with a first vent and a second vent separating the first segment and the second segment of the conductive layer.

14. The semiconductor device of claim 13, further including:
    a semiconductor die disposed over the substrate; and
    a bump material disposed in the first vent and second vent.

15. The semiconductor device of claim 13, further including a patterning layer formed over the surface of the substrate and the conductive layer.

16. The semiconductor device of claim 13, wherein a thickness of the conductive bridge is less than a thickness of the first segment and second segment of the conductive layer.

17. The semiconductor device of claim 13, further including a composite interconnect structure including a fusible portion and a non-fusible portion disposed over the conductive layer.

18. A semiconductor device, comprising:
    a substrate;
    a first conductive layer formed over a surface of the substrate with a vent separating a first segment of the first conductive layer from a second segment of the first conductive layer; and
    a semiconductor die including an interconnect structure formed over a surface of the semiconductor die disposed over the substrate with a portion of the interconnect structure channeled into the vent.

19. The semiconductor device of claim 18, wherein the portion of the interconnect structure channeled into the vent reduces interconnect void formation.

20. The semiconductor device of claim 18, further including a second conductive layer formed over the surface of the substrate between the first segment and second segment of the first conductive layer.

21. The semiconductor device of claim 20, wherein a thickness of the second conductive layer is less than a thickness of the first conductive layer.

22. The semiconductor device of claim 20, wherein the second conductive layer extends along a length of the first segment and second segment of the first conductive layer and a thickness of the second conductive layer is less than a thickness of the first conductive layer.

23. The semiconductor device of claim 18, further including a patterning layer formed over the surface of the substrate and the first conductive layer.

24. The semiconductor device of claim 23, wherein a portion of the patterning layer over the first segment and second segment of the first conductive layer is removed.

25. A semiconductor device, comprising:
    a substrate;
    a first conductive layer formed over the substrate with a vent separating a first segment of the first conductive layer from a second segment of the first conductive layer; and
    an interconnect structure disposed over the first conductive layer including a portion of the interconnect structure disposed in the vent.

26. The semiconductor device of claim 25, further including a semiconductor die disposed over the interconnect structure.

27. The semiconductor device of claim 25, further including a second conductive layer formed over the substrate between the first segment and second segment of the first conductive layer.

28. The semiconductor device of claim 27, wherein the second conductive layer extends along a length of the first segment and second segment of the first conductive layer and a thickness of the second conductive layer is less than a thickness of the first conductive layer.

29. The semiconductor device of claim 25, further including a patterning layer formed over the substrate.

30. The semiconductor device of claim 29, wherein the patterning layer extends over the first segment and second segment of the first conductive layer.

31. A semiconductor device, comprising:

a substrate; and a first conductive layer formed over the substrate with a vent separating a first segment of the first conductive layer from a second segment of the first conductive layer.

32. The semiconductor device of claim 31, further including a semiconductor die including an interconnect structure formed over a surface of the semiconductor die disposed over the substrate with a portion of the interconnect structure disposed in the vent.

33. The semiconductor device of claim 32, wherein the interconnect structure includes a fusible portion and a non-fusible portion.

34. A semiconductor device, comprising:

a substrate;

a first conductive layer formed over the substrate with a vent separating a first segment of the first conductive layer from a second segment of the first conductive layer; and a second conductive layer formed between the first segment and second segment of the first conductive layer.

35. The semiconductor device of claim 34, wherein a thickness of the second conductive layer is less than a thickness of the first conductive layer.

36. The semiconductor device of claim 31, further including a patterning layer formed over the substrate.

37. The semiconductor device of claim 36, wherein the patterning layer extends over the first segment and second segment of the first conductive layer.

* * * * *